(12) United States Patent
Jain et al.

(10) Patent No.: US 7,031,898 B2
(45) Date of Patent: Apr. 18, 2006

(54) MECHANISM FOR RECOGNIZING AND ABSTRACTING MEMORY STRUCTURES

(75) Inventors: Alok Jain, New Delhi (IN); Erich Marschner, Ellicott City, MD (US); Swapnajit Chakraborti, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 901 days.

(21) Appl. No.: 10/029,547

(22) Filed: Dec. 21, 2001

(65) Prior Publication Data

US 2003/0120473 A1    Jun. 26, 2003

(51) Int. Cl.
  *G06F 17/50*   (2006.01)
  *G11C 11/22*   (2006.01)

(52) U.S. Cl. .............................. 703/14; 716/3; 365/177

(58) Field of Classification Search ................. 703/14; 365/177; 716/3
  See application file for complete search history.

(56) References Cited

U.S. PATENT DOCUMENTS 5,734,798 A * 3/1998 Allred .......................... 706/47
6,044,004 A * 3/2000 Kramer ........................ 365/45

OTHER PUBLICATIONS

M. Pandey, et al., "Exploiting Symmetry when Verifying Transistor-Level Circuits by Symbolic Trajectory Evaluation," IEEE, vol. 18, No. 7, Jul. 1999, pp. 918-935.
D. T. Blaauw, et al., "Functional Abstraction of Logic Gates for Switch-Level Simulation," European Conference on Design Automation, pp. 329-333, Feb. 1991.
S. Kundu, "GateMaker: A Transistor to Gate Level Model Extractor for Simulation, Automatic Test Pattern Generation and Verification," International Test Conference, pp. 372-381, 1998.
R. E. Bryant, "Algorithmic Aspects of Symbolic Switch Network Analysis," IEEE Transactions on Computer Aided Design, pp. 618-633, Jul. 1987.

(Continued)

*Primary Examiner*—Hugh Jones
(74) *Attorney, Agent, or Firm*—Hickman Palermo Truong & Becker, LLP

(57) ABSTRACT

A mechanism is disclosed for recognizing and functionally abstracting a column of memory cells. According to one embodiment, a column of n (where n is an integer greater than 1) memory cells is identified in a description of a circuit. One of the n memory cells is selected as a representative memory cell. Then, the column of n memory cells is represented as a single-memory-cell column comprising the representative memory cell. The column is thereafter functionally abstracted to derive a logic-level representation of the memory cell. After that is done, n−1 additional instances of the logic-level representation are generated. In this manner, the column of n memory cells is functionally abstracted as a column of n logic-level representations of the representative memory cell.

39 Claims, 10 Drawing Sheets

OTHER PUBLICATIONS

R. E. Bryant, "Boolean Analysis of MOS Circuits," IEEE Transactions on Computer Aided Design, pp. 634-649, Jul. 1987.

R. E. Bryant, "Extraction of Gate Level Models From Transistor Circuits by Four-Valued Symbolic Analysis," International Conference on Computer Aided Design, pp. 350-353, 1991.

S. Jain, et al., "Automatic Clock Abstraction from Sequential Circuits," Design Automation Conference, pp. 707-711, 1995.

R. Radzan, et al., "Clock Suppression Techniques for Synchronous Circuits," IEEE Transactions on Computer Aided Design of Integrated Circuits and Systems, pp. 1547-1556, Oct. 1993.

F. Rocheteau, et al., "Tralala: A Fast and Accurate Functional Abstraction Tool For Transistor Netlists," SAME 99, Accessible from http://www.sansistor.com, no date no page.

* cited by examiner

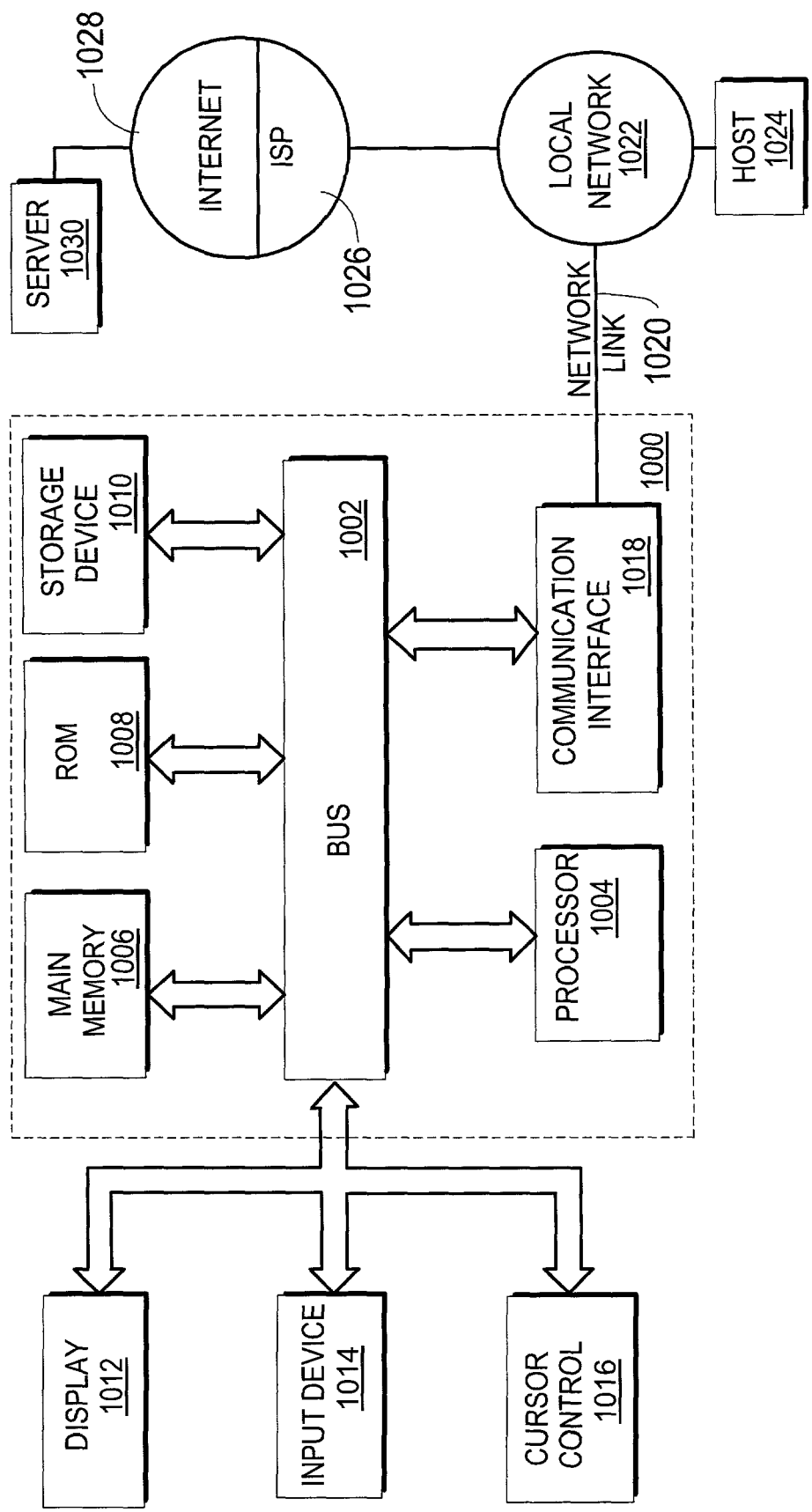

MECHANISM FOR RECOGNIZING AND ABSTRACTING MEMORY STRUCTURES

FIELD OF THE INVENTION

This invention relates generally to circuit analysis and more particularly to a mechanism for recognizing and abstracting memory structures.

BACKGROUND

In the field of electronic component design, engineers use simulation tools on a regular basis to test their designs. With such tools, engineers are able to detect and correct errors, and enhance the functionality of their designs without actually building a physical component. This leads to great savings in manufacturing and design costs. Over the years, a number of techniques and tools have been developed to aid in the simulation process.

Currently, simulation tools can simulate and test the behavior of a component design on several different levels. One level at which designs can be simulated is the transistor level. To test a design at this level, an engineer typically specifies a design using a transistor level description language, such as SPICE or SPECTRE. The design is then run through a transistor level simulation tool. Based upon the results of the simulation, the engineer can determine whether the design operated properly. While simulating a design at the transistor level is effective, it is often not the most efficient way to test a design, because transistor level simulation is relatively slow and quite resource intensive, and because designers often are not interested in the operation of a design at that low a level. As a result, it is often preferable to simulate the operation of a design at the more abstract (Boolean) logic level rather than at the transistor level.

To simulate a design at the logic level, a logic-level representation of the design is needed. A logic-level representation may be derived by submitting the transistor level description of the design to an abstraction mechanism, and having the abstraction mechanism generate an equivalent logic-level description. The logic-level description may be in a higher level description language such as Verilog HDL. In generating the logic-level description, the abstraction mechanism analyzes various combinations of transistors and circuit elements in the transistor level description of the design, and transforms the combinations into elements that perform higher level functions (e.g. AND function, OR function, etc.). By abstracting the functions performed by various transistors and circuit elements, the abstraction mechanism generates a logic-level representation of the design, which is simpler and more efficient to simulate. Once derived, the logic-level representation may be submitted to an event-driven, logic-level simulator for simulation.

Currently, three basic approaches are used to perform functional abstraction on a transistor level representation. These are pattern matching, transformation rules, and symbolic analysis. With pattern matching, a user specifies to the abstraction mechanism a set of transistor level patterns. The abstraction mechanism then performs the abstraction by looking for all instances of those patterns in the transistor level representation. With transformation rules, the user specifies a set of rules for transforming or replacing portions of a transistor level representation with certain logic gates. Using these rules, the abstraction mechanism makes the specified transformations throughout the transistor level representation. A major issue with these two approaches is that they both require the user to provide a complete set of patterns or transformation rules. As a result, their application is somewhat limited to abstraction of structured designs in which only a limited set of transistor level configurations are used.

The third approach, symbolic analysis, is an algorithmic technique that abstracts functionality based upon transistor sizes and connectivity. Given a transistor level representation, symbolic analysis generates a functionally equivalent logic-level representation using logic primitives and explicit delays (previous state is modeled with an explicit delay). An advantage of symbolic analysis is that it does not require users to specify patterns or transformation rules. Thus, it performs abstraction "automatically". A disadvantage of symbolic analysis is that it outputs a logic-level representation that can only be submitted to an event-driven, logic-level simulator for simulation. The output of symbolic analysis cannot be submitted to a cycle simulator, or an equivalence checker because it is not a cycle ready model. Symbolic analysis is described in detail in R. E. Bryant, "Extraction of Gate-level Models from Transistor Circuits by Four-Valued Symbolic Analysis," International Conference on Computer Aided Design, 1991, pages 350–353, and in R. E. Bryant, "Boolean Analysis of MOS circuits," IEEE Transactions on Computer Aided Design, July 1987, pages 634–649. Both of these references are incorporated herein in their entirety by reference.

Overall, the abstraction techniques currently used are relatively rudimentary. They provide some capability for functionally abstracting simple elements, but they do not enable more complex structures, such as columns in a memory, to be abstracted sufficiently for logic-level simulation. Because such structures are quite prevalent in modern component design, such an abstraction capability is needed.

SUMMARY

In view of the limitations of the prior art, there is provided an abstraction mechanism, which is capable of recognizing and abstracting memory columns. In one embodiment, the mechanism generates a cycle ready representation of the memory columns. Because the representation is cycle ready, it can be submitted to a cycle simulator, an equivalence checker, or an emulator for further simulation and emulation.

According to one embodiment, the abstraction mechanism abstracts a memory column as follows. Initially, the abstraction mechanism accesses a description of a circuit. In one embodiment, the description is a transistor level representation of the circuit. From the description, the abstraction mechanism identifies at least one column of n memory cells in the circuit, where n is an integer greater than 1. After the column is identified, the abstraction mechanism selects one of the n memory cells as a representative memory cell. In one embodiment, the representative memory cell is substantially identical in structure to each of the other memory cells in the column. Then, the abstraction mechanism represents the column of n memory cells as a single-memory-cell column comprising the representative memory cell. In effect, the abstraction mechanism reduces the column of n memory cells down to a column of a single memory cell. This serves to simplify the column to enable functional abstraction to be performed more effectively and efficiently. Thereafter, the abstraction mechanism functionally abstracts the column to derive a logic-level representation of the representative memory cell. In one embodiment, the logic-level representation comprises a latch, since that is generally the function performed by the memory cell. After that is done, the abstraction mechanism generates n−1 additional instances of the logic-level representation, one for each of the memory cells other than the representative memory cell. This results in the derivation of a column of n logic-level representations of the representative memory cell. Since the representative memory cell is substantially identical to each of the other memory cells, this abstraction accurately captures the functionality of the memory column.

Such an abstraction captures the functionality of the memory column in a simple, clean, and intuitive manner. Such an abstraction is also cycle ready. Hence, it may be submitted to a cycle simulator, an equivalence checker, or an emulator for further simulation and emulation. Overall, the abstraction mechanism disclosed herein is a significant improvement over the prior art.

The abstraction mechanism has been discussed thus far in the context of a single memory column. It should be noted that the abstraction mechanism may be applied to each of the columns of a memory array to functionally abstract the entire memory array. In one embodiment, the abstraction mechanism may be used to abstract a memory array with one or more column multiplexers. In such an implementation, the definition of the memory columns may be modified to specify that the memory columns are multiplexed together by the column multiplexer(s). This and other implementations and uses of the abstraction mechanism are possible.

BRIEF DESCRIPTION OF THE DRAWINGS

FIG. 10 is a functional block diagram of a computer system in which one embodiment of the present invention may be implemented.

DETAILED DESCRIPTION OF EMBODIMENT(S)

A technique is disclosed below for recognizing and abstracting memory columns. The technique is implemented by an abstraction mechanism. In one embodiment, the abstraction mechanism takes the form of a set of computer program instructions executed by one or more processors. In an alternative embodiment, the abstraction mechanism may take the form of customized circuitry. These and other embodiments are within the scope of the present invention.

Background Discussion of Memory Structure Abstraction

Before describing the technique in detail, some background discussion on memory structures, and the difficulties associated with performing functional abstraction on such structures, will be provided in order to facilitate a complete understanding of the invention. To aid in this discussion, reference will be made to a specific example.

Figure 1:
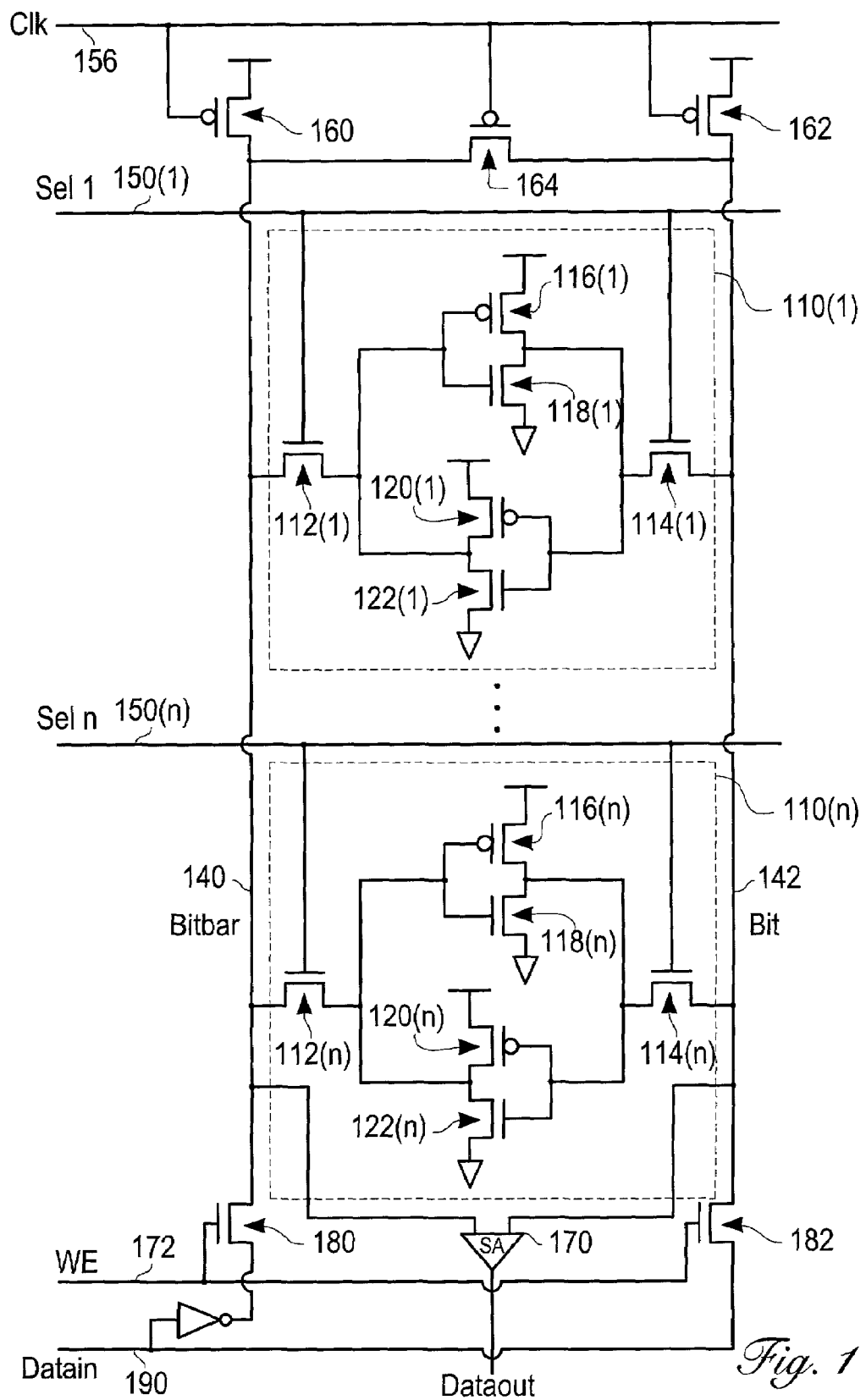
FIG. 1 shows a portion of a transistor level description of a typical memory block.

FIG. 1 shows a circuit diagram of a portion of a typical random access memory structure or memory block (RAM block). For the sake of simplicity, FIG. 1 shows only one column of the memory block, but it should be noted that most memory blocks comprise multiple columns. As shown in FIG. 1, the memory column comprises an n number of memory cells 110. Each memory cell 110 comprises six transistors, with two pass transistors 112, 114 that act as bi-directional input/output ports, and four internal transistors 116–122 that form two back-to-back invertors for storing a data value.

Each memory cell 110 is coupled to a bit line 142 and to a bitbar line 140 to enable the memory cell 110 to output data and to receive input data. During a write operation, the bit and bitbar lines 142, 140 are strongly driven by drive transistors 182, 180 to force a data value into one of the memory cells 110. During a read operation, the bit and bitbar lines 142, 140 are driven by the selected memory cell 110 so that the output of the memory cell 110 can be sensed by the sense amp 170.

Each memory cell 110, and more specifically, each of the pass transistors 112, 114 of each memory cell 110, is coupled to a corresponding select line 150, which is used to select a particular memory cell 110 (or a particular row of memory cells, one from each of several parallel columns). Each select line 150 is received from a row address decoder (not shown). During proper operation, only one of the select lines 150 will be asserted at any one time; thus, only one of the memory cells 110 of a given column will be activated at any one time.

During normal operation, any of the memory cells 110 of the column may be individually activated to carry out a read or a write operation. To implement a read cycle, the Clk signal 156 starts low. This allows the bit and bitbar lines 142, 140 to precharge. The balancing transistor 164 between the bit and bitbar lines 142, 140 equalizes the charge distribution between the two lines. During this phase of the clock, each of the memory cells 110 is isolated from the bit and bitbar lines 142, 140 because all of the select lines 150 are inhibited (this inhibition is not shown). When the Clk 156 rises, one of the select lines 150 is asserted, which causes one of the memory cells 110 to be selected. In response, the selected memory cell 110 drives the bit and bitbar lines 142, 140 to opposite values. The sense amp 170 detects the differential charge and drives the output to an appropriate logic 0 or logic 1 value. The selected memory cell 110 is thus read.

To implement a write cycle, the operation is similar, except that during the high phase of the Clk 156, the drivers 182, 180 for the bit and bitbar lines 142, 140 drive an input data value into the selected memory cell 110. More specifically, during a write cycle, a write enable signal 172 (received from a write enable circuit, not shown) activates the drivers 180, 182. While the drivers 180, 182 are activated, a write circuit (not shown) provides a data value on the data input line 190. This data value is driven by the drivers 182, 180 onto the bit and bitbar lines 142, 140 to store the input data value into the selected cell. To do so, the drivers 180, 182 need to be strong enough to overcome the inverters in the selected memory cell 110. If they are, then the input data value will be stored in the selected cell.

As the above discussion illustrates, each of the memory cells 110 in the memory column behaves very much like an individually accessible latch (under the assumption that the select lines 150 are mutually exclusive). That is, under the proper conditions (i.e. during a write cycle), each cell 110 is able to store or latch in a data value. Under other conditions (i.e. during a read cycle), each cell 110 is able to output a stored data value. Since each memory cell 110 behaves like a latch, it would be desirable from a functional abstraction point of view to abstract the memory column as a plurality of individual latches (with some other accompanying logic). While it makes intuitive sense for the memory column to be abstracted in this way, current abstraction techniques (to the best of our knowledge) have been unable to do so.

One of the factors that have made functional abstraction of a memory column difficult has been the structure of a memory column itself. As noted previously, one of the techniques currently used to abstract a transistor level representation of a circuit to a logic-level representation is symbolic analysis. According to this technique, a circuit is first separated into distinct channel connected regions (CCR's). All of the transistors in a CCR are couple to each other via their source/drain terminals. After the CCR's are identified, symbolic analysis is applied to each of the CCR's to derive a gate-level representation of the circuit.

One of the problems with applying this approach to memory columns is that the memory cells in a memory column do not divide well into individual CCR's. Rather, all of the memory cells of a column are often part of the same pair of CCR's. This can be seen in the memory column of FIG. 1. Specifically, the transistors 112, 120, 122 of each of the memory cells 110 in the column are part of one CCR, while the transistors 116, 118, 114 of each of the memory cells 110 in the column are part of another CCR. Thus, in the column shown, there are basically two CCR's, each CCR encompassing a portion of each of the memory cells 110. If symbolic analysis is applied to this column, a very complex gate-level representation will be derived which does not correspond well to the logical operation of the memory column as individual memory cells. Consequently, abstracting the entire column using symbolic analysis does not produce a clean and intuitive representation of the column.

As an alternative approach, instead of abstracting the entire column, each memory cell 110 may be abstracted individually. This is very difficult due to the presence of the bi-directional ports in each of the memory cells 110. As noted above, each of the pass transistors 112, 114 (which act as bi-directional ports) in a memory cell 110 is channel coupled to other transistors outside the cell. As a result, modeling the memory cell 110 as an individual component requires cutting the CCR's at the cell boundary, and then somehow representing the behavior of the ports at the cell boundary. This behavior ultimately reduces to the ability of the external portion of the CCR to overdrive the internal portion (for a write operation), and the ability of the internal portion of the CCR to overdrive the external portion (for a read operation).

One way to implement this approach is to represent different drive strengths inside and outside the memory cell 110. For a write operation, the cell 110 could be defined to drive its outputs weakly, and the rest of the column could be modeled to drive the ports strongly. Similarly, for a read operation, the cell 110 could be defined to drive its outputs strongly, and the rest of the column could be modeled to drive the ports weakly or not at all. While this approach can be used to model each memory cell 110 individually, it does not produce optimal results. The model of the memory column thus derived is not as abstract as would be desired. In addition, because of the need to specify different drive strengths, inefficiency and other significant problems may be introduced.

Another approach that may be used to model each memory cell 110 individually involves treating the two ports of the memory cell 110 as unidirectional ports, with one port being an input port and the other being an output port. While this approach simplifies the cell model because no drive strengths need to be specified, it does not represent the actual circuitry very faithfully. This loss of fidelity might lead to significant errors, such as false positives in a subsequent verification flow.

Yet another approach is to model the memory cell 110 with an explicit read/write input. Under this approach, the bit and bitbar lines 142, 140 are modeled as wired-OR or tristate buses, and the cell 110 reads or drives the lines 142, 140 as appropriate depending upon the explicit read/write input. Like the above approach, this approach simplifies the model at the expense of some loss in fidelity (a read/write input is injected into the model when there is no such actual input). This loss of fidelity may lead to significant subsequent errors.

Description of Novel Approach

As the above discussion shows, the current approaches to abstracting a memory column leave much to be desired. To overcome the shortcomings of these approaches, there is disclosed herein an improved mechanism for recognizing and abstracting a memory column, which enables a memory column to be efficiently and intuitively abstracted. In one embodiment, the mechanism produces a cycle ready model of the memory column. By cycle ready, it is meant that the model may be fed to a cycle simulator, an equivalence checker, or an emulator for further simulation and emulation.

Figure 2:
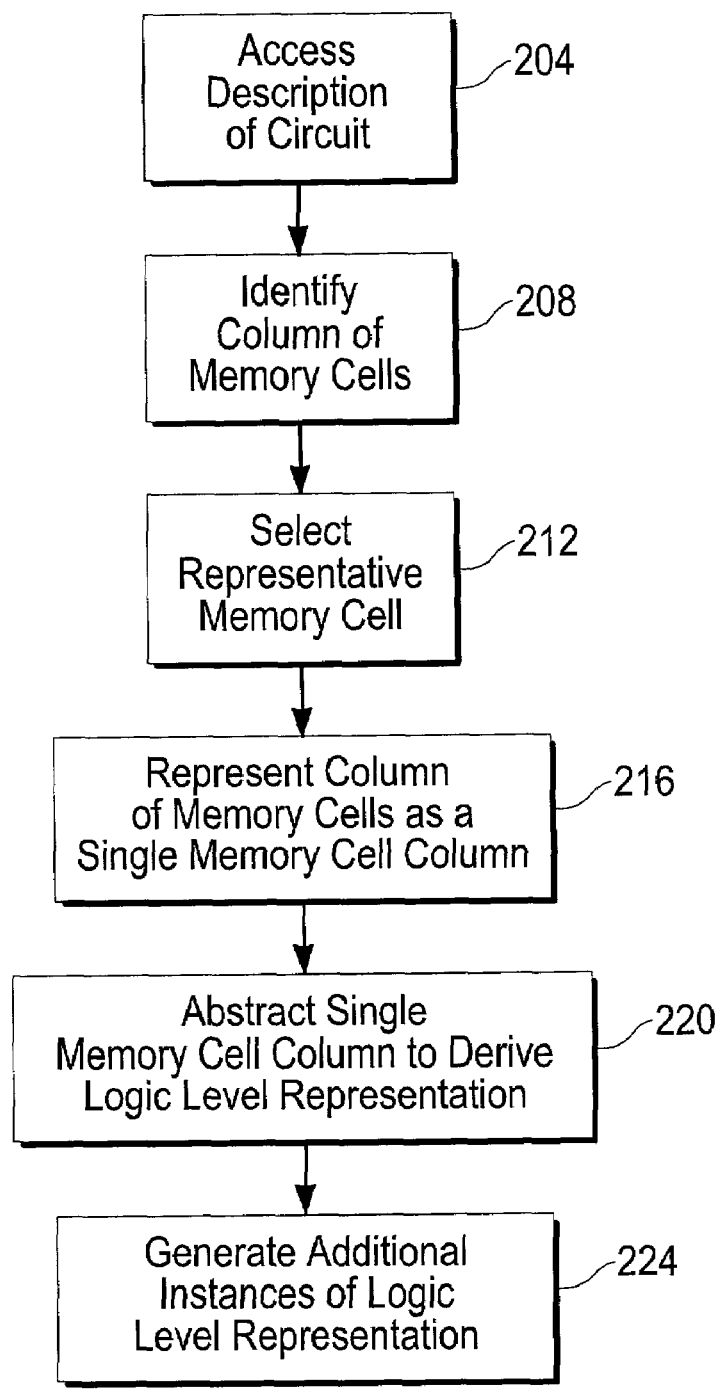
FIG. 2 is a flow diagram of one embodiment of an abstraction technique in accordance with one embodiment of the present invention.

An overview of one embodiment of a technique that may be used to abstract a memory column is shown in the flow diagram of FIG. 2. In one embodiment, this technique is implemented by an abstraction mechanism. As shown in FIG. 2, the abstraction mechanism begins the abstraction process by accessing (204) a description of a circuit. In one embodiment, this description may be a transistor level description, and the circuit may be any type of circuit comprising one or more columns of memory cells.

After the circuit description is accessed, the abstraction mechanism processes the description to identify (208) one or more columns of memory cells. For purposes of discussion, it will be assumed that each column comprises n memory cells, where n is an integer greater than 1. In identifying a column of memory cells, the abstraction mechanism, in one embodiment, performs several operations. Initially, the abstraction mechanism searches for all instances of memory cells. In one embodiment, this is done by way of pattern matching. That is, the abstraction mechanism takes a definition or a pattern of a memory cell (which may be provided by a user, accessed from a file, hardcoded into the abstraction mechanism, etc.), and looks for all instances of that pattern. Each matching pattern is marked as a memory cell. In one embodiment, during the pattern matching process, the abstraction mechanism looks for matches just in terms of transistor types and transistor connectivity. Transistor size is not taken into account during pattern matching.

Thereafter, the abstraction mechanism groups the memory cells into columns. Memory cells are grouped into the same column if they are coupled to the same set of bit lines. After the memory cells are grouped into columns, each column is tested to confirm that all of the cells in that particular column are substantially identical in structure relative to each other. In doing so, the abstraction mechanism takes into account the sizing of the transistors of each memory cell. If the abstraction mechanism determines that, for a particular column, all of memory cells in that column are substantially identical in structure relative to each other, then the abstraction mechanism identifies that column as being ready for abstraction. The column may thereafter be further abstracted. In the following abstraction process, each column may be abstracted individually, or groups of columns may be abstracted together. For the sake of simplicity, the abstraction of an individual column will be described below. This teaching may be applied to abstract groups of columns, if so desired.

After a column of n memory cells is identified, the abstraction mechanism proceeds to select (212) a representative memory cell from the column. Since all of the memory cells in the column have already been determined to be substantially identical in structure relative to each other, any of the n memory cells may be selected as the representative memory cell. Once the representative memory cell is selected, the abstraction mechanism represents (216) the column of n memory cells as a column of a single memory cell, where the single memory cell is the representative memory cell. In other words, the abstraction mechanism reduces the n memory cell column into a single memory cell column. By turning the column into a single memory cell column, the abstraction mechanism eliminates the problems (previously discussed) associated with having CCR's that span multiple memory cells. With a single memory cell column, it is possible to simply and intuitively abstract the function of the representative memory cell.

After the n memory cell column is reduced to a single memory cell column, the abstraction mechanism abstracts (220) the column, and hence, the representative memory cell, to derive a logic-level representation of the representative memory cell. In one embodiment, the abstraction mechanism carries out this abstraction process by initially performing symbolic analysis on the column to derive a gate-level representation, and then applying a latch recognition technique to the gate-level representation to recognize and abstract a data latch. A technique for recognizing and abstracting a latch is fully disclosed in co-pending U.S. patent application Ser. No. 10/014,176 entitled MECHANISM FOR RECOGNIZING AND ABSTRACTING PRE-CHARGED LATCHES AND FLIP-FLOPS, filed on Dec. 11, 2001, naming Alok Jain and Manpreet Reehal as inventors, which is incorporated in its entirety herein by this reference. Thus, in one embodiment, after the abstraction process is carried out, the representative memory cell is modeled as a latch and some accompanying gate-level logic. This model serves as the logic-level representation of the representative memory cell.

After the logic-level representation of the representative memory cell is derived, the abstraction mechanism generates (224) n−1 additional instances of the logic-level representation, one for each of the n memory cells in the column other than the representative memory cell (for which a logic-level representation instance has already been generated). These instances serve as the functional abstractions for each of the other memory cells. The result of this process is that an abstracted memory column is produced comprising n instances of the logic-level representation of the representative memory cell. Since the representative memory cell is substantially identical in structure to all of the other memory cells in the column, its logic-level representation accurately captures the function of each of those memory cells (under the assumption that the select lines are mutually exclusive). Thus, the abstracted memory column accurately captures the function of the overall memory column. In the manner described, the abstraction mechanism recognizes and abstracts a memory column. This abstraction is cycle ready, and may be submitted to a cycle simulator, an equivalence checker, or an emulator for further simulation and emulation. It also captures the functionality of the memory column in a simple and intuitive manner. Thus, it represents an effective abstraction for the memory column.

Application of Novel Approach to Sample Circuit

With reference to FIGS. 1, and 3–9, the application of the above technique to a sample memory circuit will now be described. In the following discussion, the technique is applied to a static RAM. However, it should be noted that the technique is not so limited but rather may be applied to other types of memory structures, including but not limited to ROM structures.

FIG. 1 shows a column of a static RAM, the column comprising n memory cells 110, where n is an integer greater than 1. Each memory cell 110 has bi-directional input/output ports coupled to the bit and bitbar lines 142, 140. Each memory cell 110 is further coupled to a distinct select line 150 from a decoder (not shown). During proper operation, only one of the select lines 150 should be activated by the decoder at any one time so that only one of the memory cells 110 of the column is selected at any one time.

In addition to the memory cells 110, the column further comprises precharge transistors 160, 162, and balancing transistor 164, all of which are activated/deactivated by the Clk signal 156. The column further comprises driver transistors 182, 180, which are activated by a write enable signal 172, for driving a data value received on the Datain line 190 onto the bit and bitbar lines 142, 140 to store the data value into a selected memory cell 110. The write enable signal 172 and the Datain signal 190 are provided by a write enable circuit and a write circuit, respectively. For the sake of simplicity and clarity, these are not shown in FIG. 1. In addition to the elements already mentioned, the column further comprises a sense amp 170. The sense amp 170 senses the differential charge on the bit and bitbar lines 142, 140, and outputs a Dataout value based upon the differential charge. The sense amp 170 outputs a data value during a read operation.

In FIG. 1, the memory column is shown graphically. In actual implementation, the circuit would be represented as a netlist, wherein the circuit is described using a description language such as SPICE or SPECTRE. Such a description would likely be at the transistor level. Using this description, the abstraction mechanism generates a functional model (logic-level representation) of the column in accordance with one embodiment of the present invention.

In generating the functional model, the abstraction mechanism first accesses the description of the circuit. From the description, the abstraction mechanism identifies the memory column. To do so, the abstraction mechanism initially searches for all instances of memory cells. In one embodiment, the abstraction mechanism finds memory cells by performing pattern matching. In this example, it will be assumed that a user provides a pattern for the memory cell. In other implementations, the abstraction mechanism may obtain a memory cell pattern from a file, or the pattern may be hardcoded into the abstraction mechanism. After the abstraction mechanism has the memory cell pattern, it searches for all matching instances in the circuit description. Each matching instance is marked as a memory cell. In one embodiment, during the pattern matching process, the abstraction mechanism looks for matches just in terms of transistor types and transistor connectivity. Transistor size is not taken into account during pattern matching. In the present example, using pattern matching, the abstraction mechanism finds all of the n memory cells 110 in the column.

Thereafter, the abstraction mechanism groups the memory cells 110 into columns. Memory cells are grouped into the same column if they are coupled to the same set of bit lines. In the present example, all of the n memory cells 110 are coupled to the bit and bitbar lines 142, 140. Thus, the abstraction mechanism groups the n memory cells 110 into a column.

Thereafter, the abstraction mechanism tests each of the memory cells 110 in the column to confirm that all of the memory cells 110 are substantially identical in structure relative to each other. In doing so, the abstraction mechanism takes into account the sizing of the transistors of each memory cell 110. If the abstraction mechanism determines that all of the memory cells 110 in the column are substantially identical in structure, then the abstraction mechanism identifies the column as being ready for abstraction. In the present example, it will be assumed that all of the memory cells 110 are substantially identical in structure relative to each other; thus, the column may be further abstracted.

Figure 3:
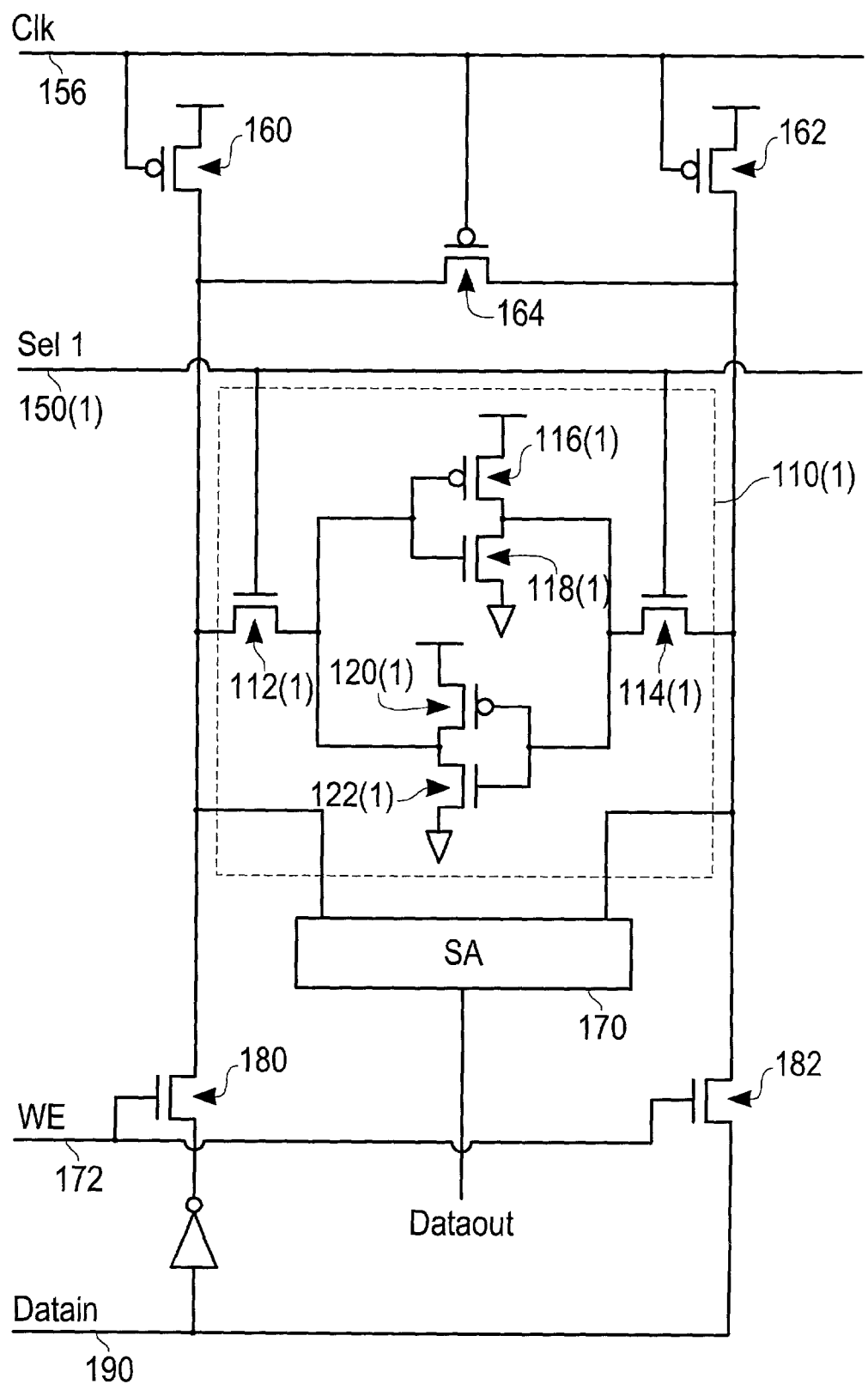
FIG. 3 shows the memory column of FIG. 1 after the column of n memory cells has been reduced to a single memory cell column.

To further abstract the memory column, the abstraction mechanism initially selects a representative memory cell from the column. Since all of the memory cells 110 in the column have already been determined to be substantially identical in structure relative to each other, any of the n memory cells 110 may be selected as the representative memory cell. In the present example, it will be assumed that memory cell 110(1) is selected as the representative memory cell. Once the representative memory cell 110(1) is selected, the abstraction mechanism represents the column of n memory cells 110 as a column of a single memory cell, where the single memory cell is the representative memory cell 110(1). In other words, the abstraction mechanism reduces the n memory cell column into a single memory cell column. The result of this operation is shown in FIG. 3, wherein all of the memory cells other than the representative memory cell 110(1) have been removed from the column. By turning the column into a single memory cell column, the abstraction mechanism eliminates the problems associated with having CCR's that span multiple memory cells. This in turn makes it possible to simply and intuitively abstract the function of the column and the representative memory cell 110(1).

Figure 4:
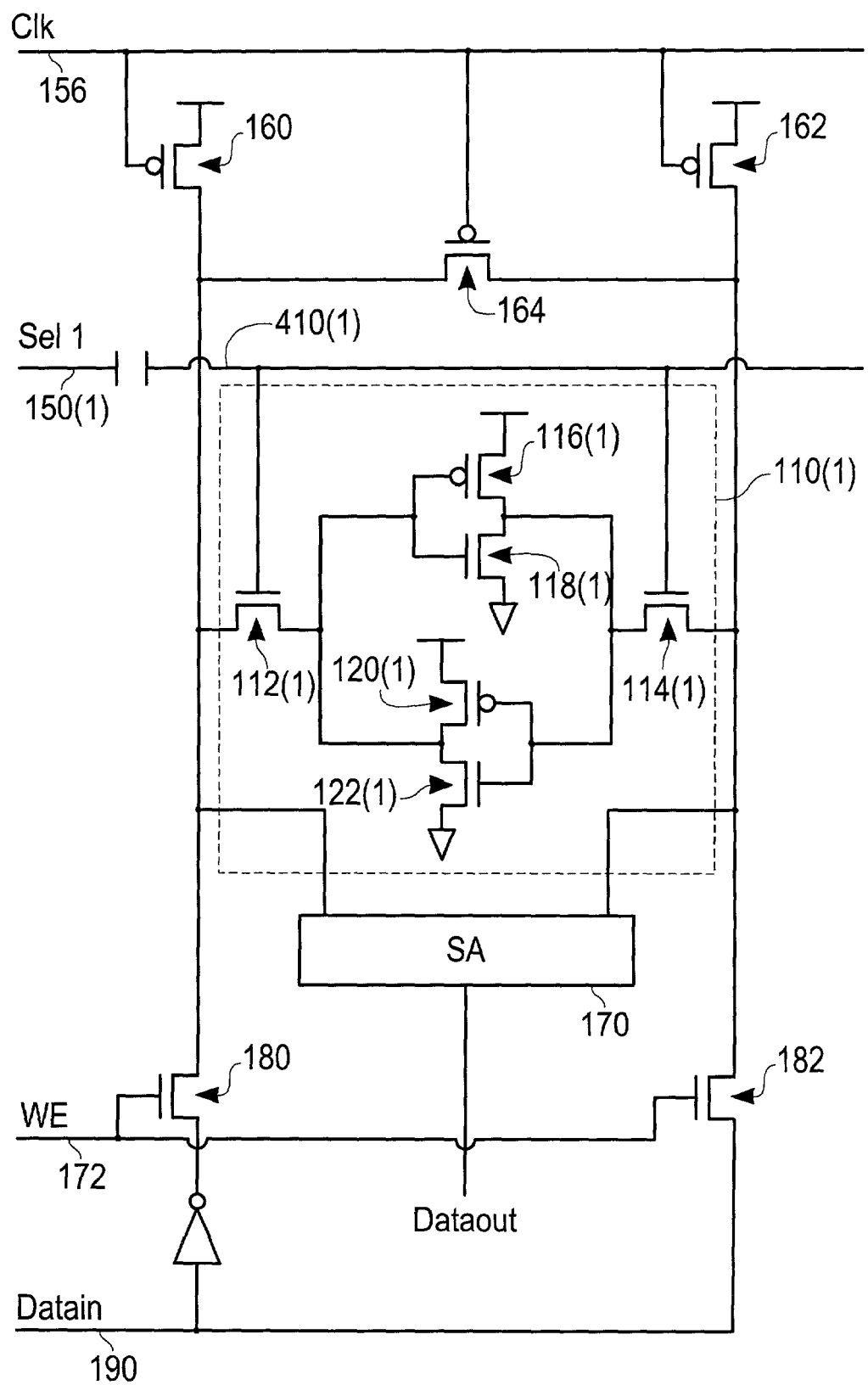
FIG. 4 shows the memory column of FIG. 3 after the select line from the decoder has been disconnected from the select line of the representative memory cell.
Figure 5:
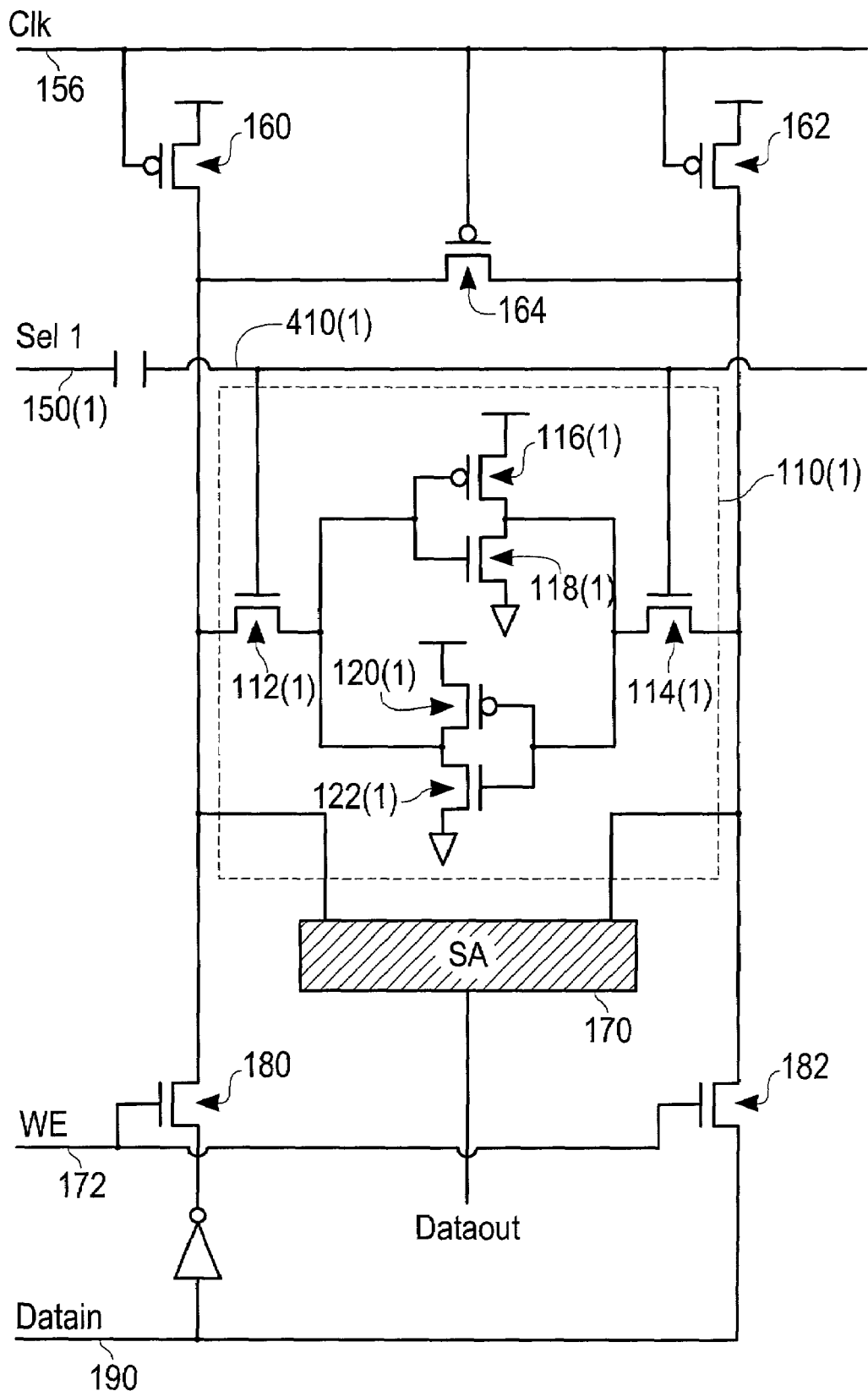
FIG. 5 shows the memory column of FIG. 4 after the sense amp has been "black boxed".
Figure 6:
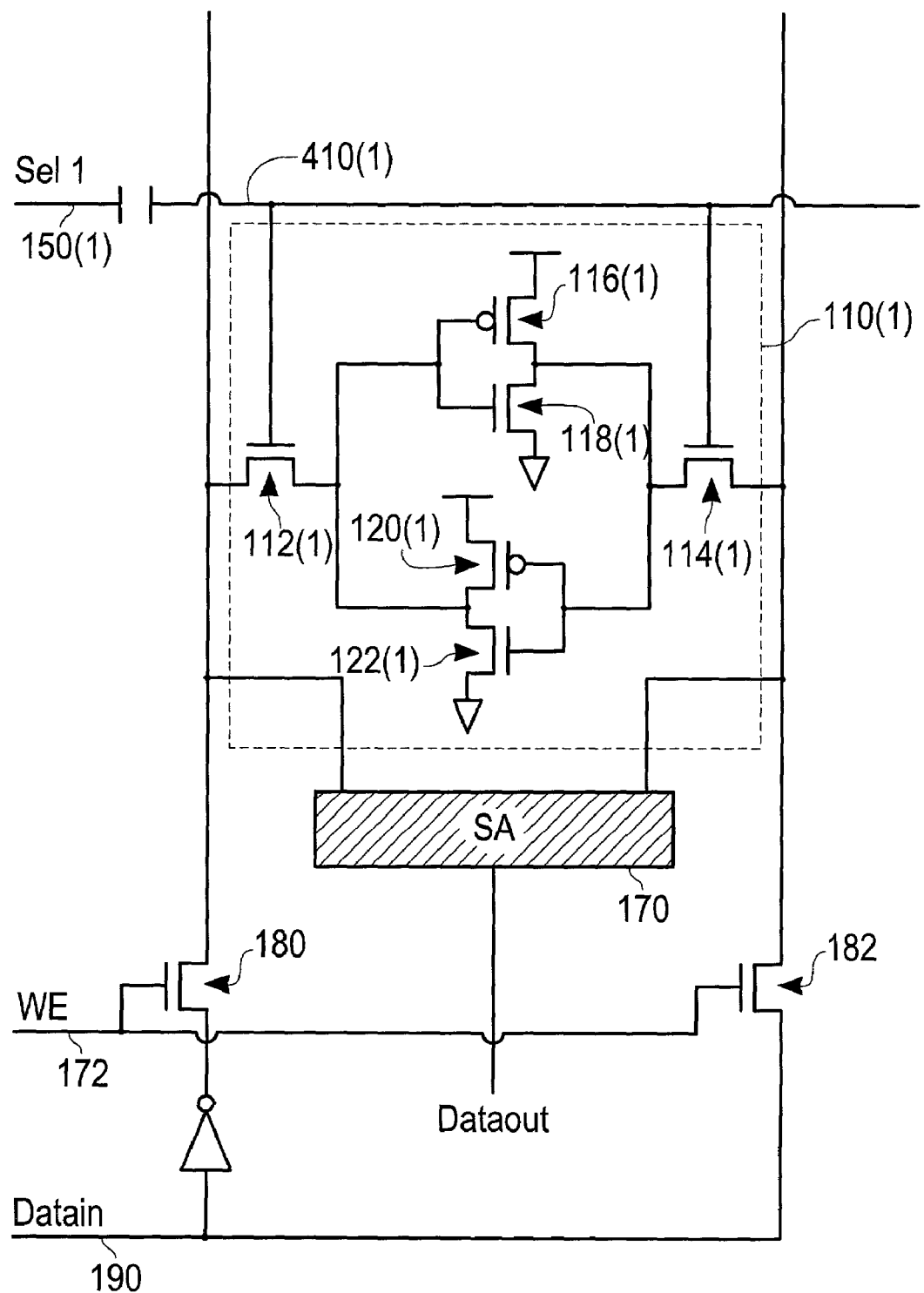
FIG. 6 shows the memory column of FIG. 5 after the precharge transistors and balancing transistor have been removed from the column.

As part of representing the column as a single memory cell column, the abstraction mechanism disconnects the select line 150(1) received from the decoder (not shown) from the select line 410(1) of the representative memory cell 110(1). This is shown in FIG. 4. In addition, to further simplify the column, the abstraction mechanism allows the user to represent the sense amp 170 as a black box. A black box representation of the sense amp 170 is desirable because the sense amp 170 is typically an analog component, which is outside the realm of a functional abstraction process. To "black box" the sense amp 170, the user provides a pattern for the sense amp 170. The abstraction mechanism performs pattern matching to find all of the sense amps 170 in the circuit description. Then, in one embodiment, the abstraction mechanism generates a wrapper (stub module) for each sense amp 170 so that the user can insert a high level definition of the sense amp 170 at a later time before submitting the abstracted model of the column to a verification tool. The result of the black boxing process is shown in FIG. 5, wherein the sense amp 170 is now depicted as a shaded element. To further simplify the column, the abstraction mechanism removes the precharge transistors 160, 162 and the balancing transistor 164. The result of this process is shown in FIG. 6. The single memory cell column is now ready for abstraction.

Figure 7:
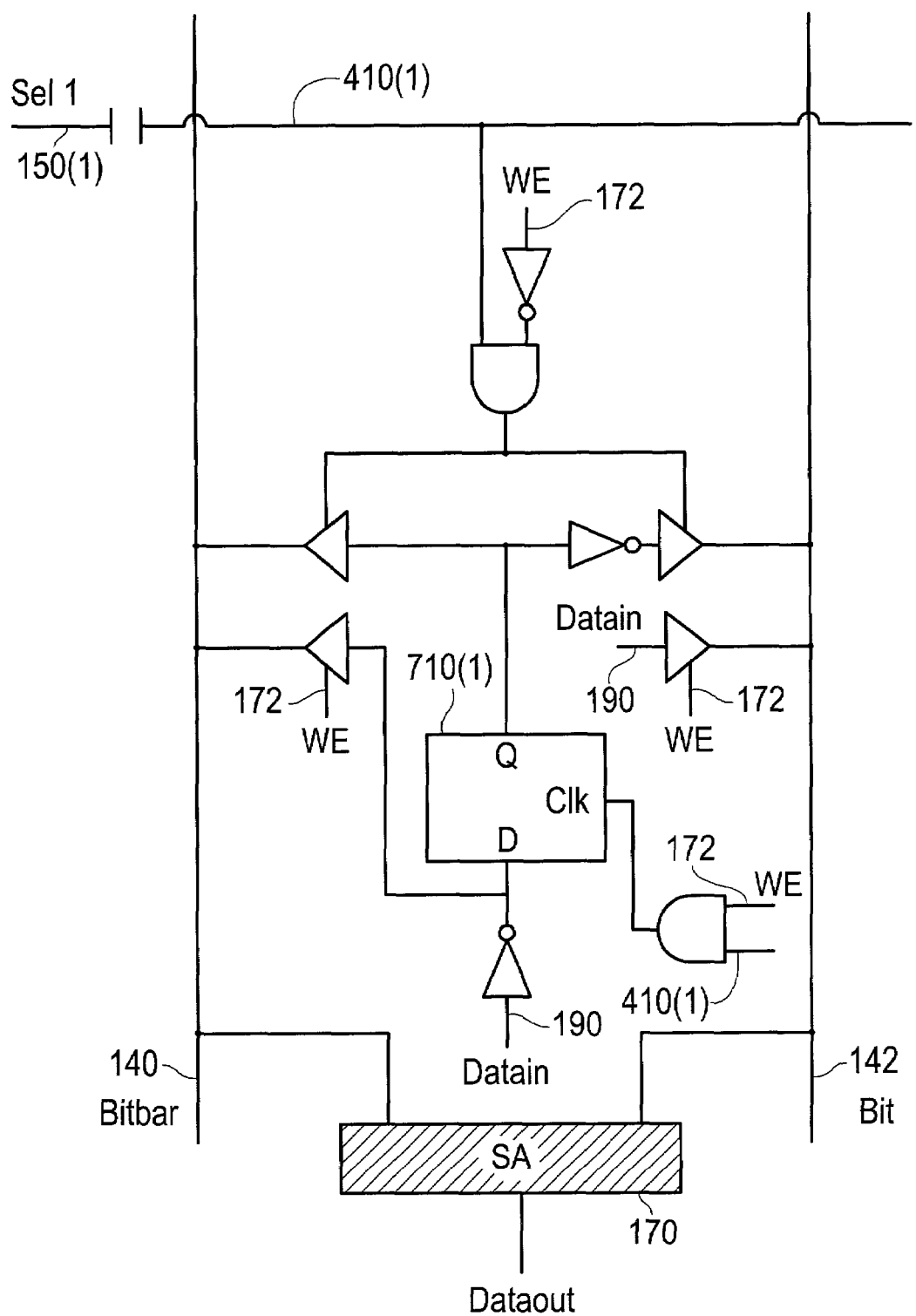
FIG. 7 shows the logic-level representation generated as a result of functionally abstracting the memory column of FIG. 6.
Figure 8:
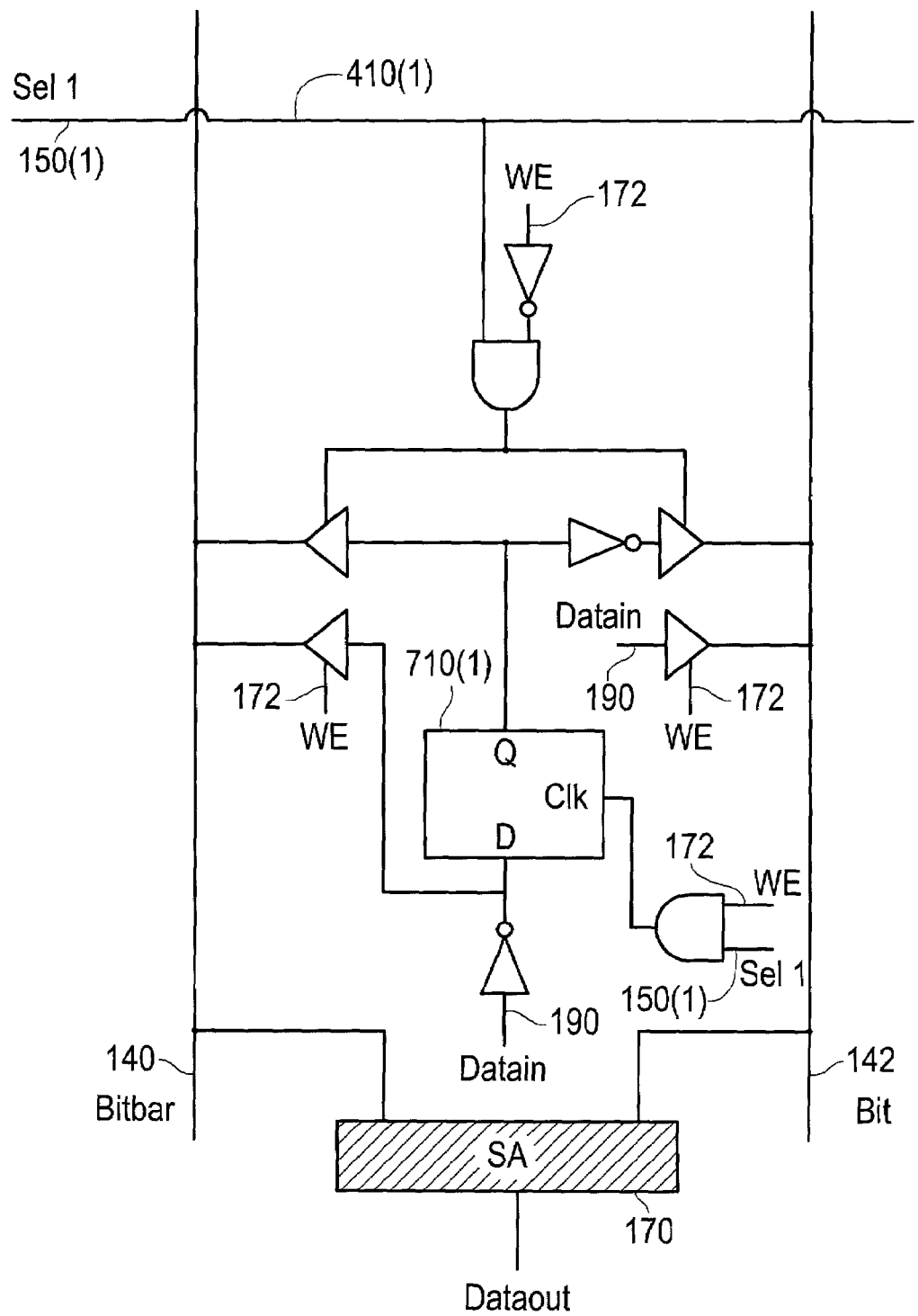
FIG. 8 shows the logic-level representation of FIG. 7 after the select line of the decoder has been reconnected with the select line of the abstracted memory cell.

In one embodiment, the abstraction mechanism abstracts the column by initially performing symbolic analysis to derive a gate-level representation of the column. During symbolic analysis, the abstraction mechanism marks the gate-level logic that is to be later replicated for each memory cell. Then, the abstraction mechanism applies the latch recognition and abstraction technique disclosed in co-pending U.S. patent application Ser. No. 10/014,176 entitled MECHANISM FOR RECOGNIZING AND ABSTRACTING PRE-CHARGED LATCHES AND FLIP-FLOPS (referenced above) to the gate-level representation to further abstract the column. The result of the abstraction process is shown in FIG. 7. As shown, the representative memory cell 110(1) is abstracted as a latch 710(1) and some accompanying logic. An analysis of the logic will reveal that this logic-level representation accurately captures the functionality of the representative memory cell 110(1). After the logic-level representation of the representative memory cell 110(1) is derived, the abstraction mechanism reconnects the select line 150(1) from the decoder (not shown) with the select line 410(1) of the memory cell, as shown in FIG. 8. Once that is done, the single memory cell column is fully abstracted.

Figure 9:
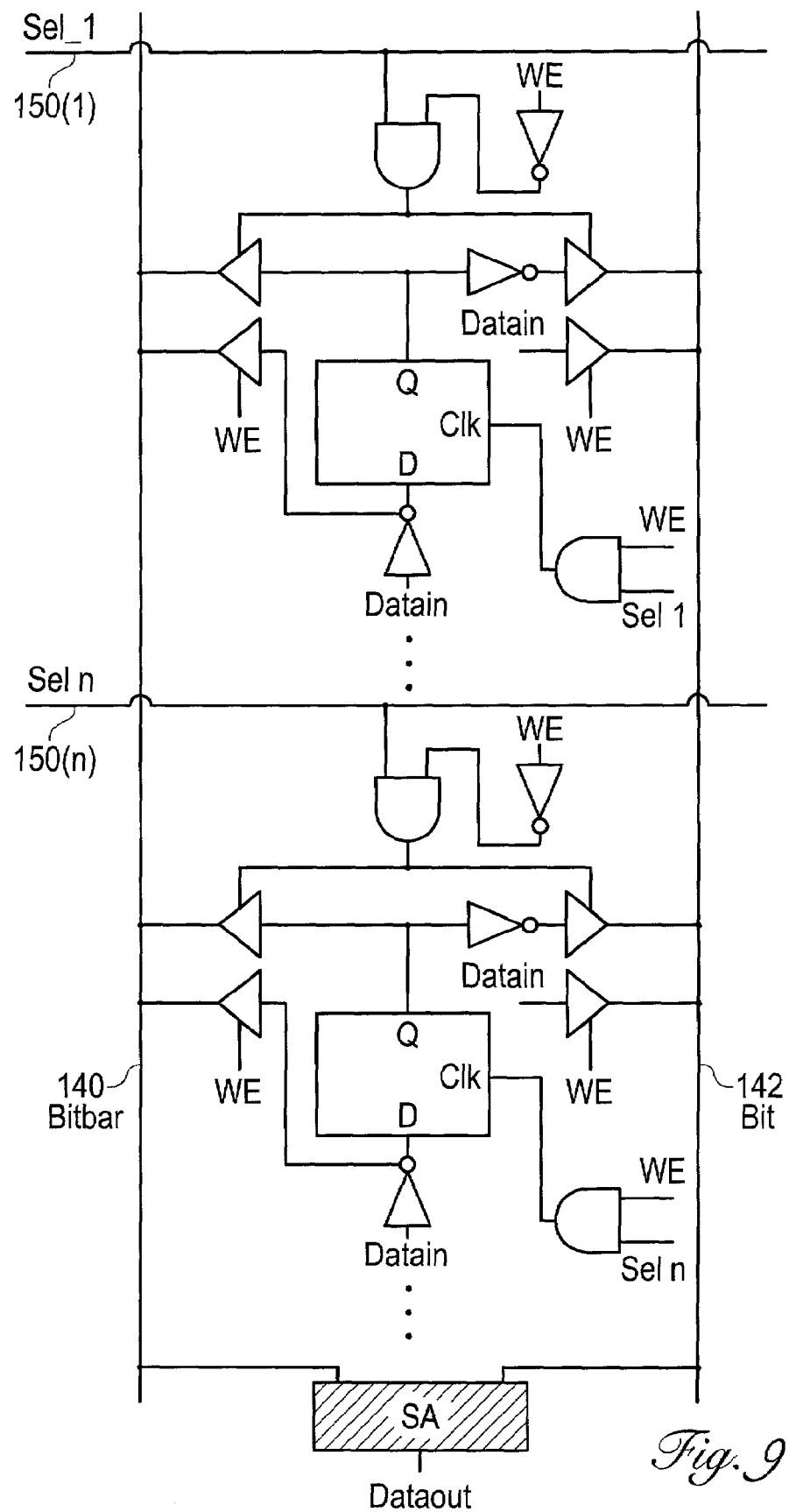
FIG. 9 shows the abstracted memory column that results after the memory column of FIG. 1 has been functionally abstracted in accordance with one embodiment of the present invention.

Thereafter, the abstraction mechanism proceeds to generate n−1 additional instances of the logic-level representation just derived, one for each of the other memory cells 110 in the original column (FIG. 1). These instances serve as the functional abstractions for each of the other memory cells. As each instance is generated, it is inserted into the abstracted column, and coupled to an appropriate select line 150. The result of this process is shown in FIG. 9. Notice that there are n instances of the logic-level representation, and that each instance is coupled to a distinct select line 150(1)–150(n). For proper operation, the select lines 150 should be mutually exclusive, that is, only one should be asserted at any one time. In one embodiment, the abstraction mechanism does not verify that this is true. Instead, it makes an explicit assumption that it is true. This assumption will be verified by subsequent simulation of the abstracted column. In another embodiment, some simple ATPG based techniques may be used to automatically ensure that this assumption is true.

In the manner described, an abstracted memory column is produced comprising n instances of the logic-level representation of the representative memory cell 110(1). Since the representative memory cell 110(1) is substantially identical in structure to all of the other memory cells in the column, its logic-level representation accurately captures the functionality of each of those memory cells. Thus, the abstracted column accurately captures the functionality of the overall memory column. In the manner described, the abstraction mechanism recognizes and abstracts a memory column. This abstraction is cycle ready, and may be submitted to a cycle simulator, an equivalence checker, or an emulator for further simulation and emulation. It also captures the functionality of the memory column in a simple and intuitive manner. Thus, the abstracted memory column represents an effective model for the original memory column.

The sample memory circuit discussed above does not comprise any column multiplexers. It should be noted that the abstraction mechanism may be applied to a memory circuit where one or more columns are multiplexed together by one or more column multiplexers. In such an application, the definition of the memory columns may be modified to specify that the memory columns are multiplexed together by the column multiplexer(s). Other than that modification, the abstraction mechanism may be applied in the same manner as that described above to abstract the one or more memory columns. This and other implementations and uses of the abstraction mechanism are possible.

Hardware Overview

In one embodiment, the abstraction mechanism of the present invention is implemented as a set of instructions executable by one or more processors. The invention may be implemented, for example, as part of an object oriented programming system. FIG. 10 shows a hardware block diagram of a computer system 1000 on which the abstraction mechanism may be implemented. Computer system 1000 includes a bus 1002 or other communication mechanism for communicating information, and a processor 1004 coupled with bus 1002 for processing information. Computer system 1000 also includes a main memory 1006, such as a random access memory (RAM) or other dynamic storage device, coupled to bus 1002 for storing information and instructions to be executed by processor 1004. Main memory 1006 may also be further used to store temporary variables or other intermediate information during execution of instructions by processor 1004. Computer system 1000 further includes a read only memory (ROM) 1008 or other static storage device coupled to bus 1002 for storing static information and instructions for processor 1004. A storage device 1010, such as a magnetic disk or optical disk, is provided and coupled to bus 1002 for storing information and instructions.

Computer system 1000 may be coupled via bus 1002 to a display 1012, such as a cathode ray tube (CRT), for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane.

According to one embodiment, the functionality of the present invention is provided by computer system 1000 in response to processor 1004 executing one or more sequences of one or more instructions contained in main memory 1006. Such instructions may be read into main memory 1006 from another computer-readable medium, such as storage device 1010. Execution of the sequences of instructions contained in main memory 1006 causes processor 1004 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 1004 for execution. Such a medium may take many forms, including but not limited to, non-volatile media, volatile media, and transmission media. Non-volatile media includes, for example, optical or magnetic disks, such as storage device 1010. Volatile media includes dynamic memory, such as main memory 1006. Transmission media includes coaxial cables, copper wire and fiber optics, including the wires that comprise bus 1002. Transmission media can also take the form of acoustic or electromagnetic waves, such as those generated during radio-wave, infra-red, and optical data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1004 for execution. For example, the instructions may initially be carried on a magnetic disk of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the world wide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are exemplary forms of carrier waves transporting the information.

Computer system 1000 can send messages and receive data, including program code, through the network(s), network link 1020 and communication interface 1018. In the Internet example, a server 1030 might transmit a requested code for an application program through Internet 1028, ISP 1026, local network 1022 and communication interface 1018. The received code may be executed by processor 1004 as it is received, and/or stored in storage device 1010, or other non-volatile storage for later execution. In this manner, computer system 1000 may obtain application code in the form of a carrier wave.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the appended claims.

What is claimed is:

1. A computer implemented method for functionally abstracting a memory column, comprising:
    identifying, in a description of a circuit, at least one column of n memory cells, where n is an integer greater than 1;
    representing said column of n memory cells as a single-memory-cell column comprising a single representative memory cell;
    abstracting at least a portion of said single-memory-cell column to derive a logic-level representation for said representative memory cell; and
    generating one or more additional instances of said logic-level representation to derive an abstracted memory column comprising a plurality of instances of said logic-level representation.

2. The method of claim 1, wherein said logic-level representation comprises a latch.

3. The method of claim 2, wherein generating one or more additional instances comprises:
    generating n−1 additional instances of said logic-level representation to derive an abstracted memory column comprising n instances of said logic-level representation.

4. The method of claim 1, wherein abstracting comprises:
    deriving a gate-level representation for said representative memory cell; and
    abstracting a latch from at least a portion of said gate-level representation.

5. The method of claim 4, wherein deriving a gate-level representation comprises:
    applying symbolic analysis to a transistor level description of said representative memory cell.

6. The method of claim 1, wherein identifying a column of n memory cells comprises:
    verifying that all of said n memory cells are substantially identical in structure relative to each other.

7. The method of claim 6, further comprising:
    selecting one of said n memory cells to be said representative memory cell.

8. The method of claim 7, wherein representing said column of n memory cells as a single-memory-cell column comprises:
    removing all of said n memory cells except for said representative memory cell from said column.

9. The method of claim 1, wherein said representative memory cell is initially coupled to a particular select line, and wherein representing said column of n memory cells as a single-memory-cell column comprises:
    decoupling said representative memory cell from said particular select line.

10. The method of claim 9, wherein abstracting said single-memory-cell column comprises:
    coupling said logic-level representation of said representative memory cell to said particular select line.

11. The method of claim 1, wherein generating additional instances of said logic-level representation comprises:
    generating one or more additional instances of said logic-level representation; and
    for each additional instance generated, coupling that instance to a distinct select line.

12. The method of claim 11, wherein generating additional instances of said logic-level representation further comprises:
    making an explicit assumption that selection of each select line is mutually exclusive relative to all other select lines.

13. The method of claim 1, wherein said abstracted memory column is cycle ready.

14. An apparatus for functionally abstracting a memory column, comprising:
    a mechanism for identifying, in a description of a circuit, at least one column of n memory cells, where n is an integer greater than 1;
    a mechanism for representing said column of n memory cells as a single-memory-cell column comprising a single representative memory cell;
    a mechanism for abstracting at least a portion of said single-memory-cell column to derive a logic-level representation for said representative memory cell; and
    a mechanism for generating one or more additional instances of said logic-level representation to derive an abstracted memory column comprising a plurality of instances of said logic-level representation.

15. The apparatus of claim 14, wherein said logic-level representation comprises a latch.

16. The apparatus of claim 15, wherein the mechanism for generating one or more additional instances comprises:
    a mechanism for generating n−1 additional instances of said logic-level representation to derive an abstracted memory column comprising n instances of said logic-level representation.

17. The apparatus of claim 14, wherein the mechanism for abstracting comprises:
    a mechanism for deriving a gate-level representation for said representative memory cell; and
    a mechanism for abstracting a latch from at least a portion of said gate-level representation.

18. The apparatus of claim 17, wherein the mechanism for deriving a gate-level representation comprises:
    a mechanism for applying symbolic analysis to a transistor level description of said representative memory cell.

19. The apparatus of claim 14, wherein the mechanism for identifying a column of n memory cells comprises:
    a mechanism for verifying that all of said n memory cells are substantially identical in structure relative to each other.

20. The apparatus of claim 19, further comprising:
    a mechanism for selecting one of said n memory cells to be said representative memory cell.

21. The apparatus of claim 20, wherein the mechanism for representing said column of n memory cells as a single-memory-cell column comprises:
a mechanism for removing all of said n memory cells except for said representative memory cell from said column.

22. The apparatus of claim 14, wherein said representative memory cell is initially coupled to a particular select line, and wherein the mechanism for representing said column of n memory cells as a single-memory-cell column comprises:
a mechanism for decoupling said representative memory cell from said particular select line.

23. The apparatus of claim 22, wherein the mechanism for abstracting said single-memory-cell column comprises:
a mechanism for coupling said logic-level representation of said representative memory cell to said particular select line.

24. The apparatus of claim 14, wherein the mechanism for generating additional instances of said logic-level representation comprises:
a mechanism for generating one or more additional instances of said logic-level representation; and
a mechanism for coupling, for each additional instance generated, that instance to a distinct select line.

25. The apparatus of claim 24, wherein the mechanism for generating additional instances of said logic-level representation further comprises:
a mechanism for making an explicit assumption that selection of each select line is mutually exclusive relative to all other select lines.

26. The apparatus of claim 14, wherein said abstracted memory column is cycle ready.

27. A computer readable medium, comprising:
instructions for causing one or more processors to identify, in a description of a circuit, at least one column of n memory cells, where n is an integer greater than 1;
instructions for causing one or more processors to represent said column of n memory cells as a single-memory-cell column comprising a single representative memory cell;
instructions for causing one or more processors to abstract at least a portion of said single-memory-cell column to derive a logic-level representation for said representative memory cell; and
instructions for causing one or more processors to generate one or more additional instances of said logic-level representation to derive an abstracted memory column comprising a plurality of instances of said logic-level representation.

28. The computer readable medium of claim 27, wherein said logic-level representation comprises a latch.

29. The computer readable medium of claim 28, wherein the instructions for causing one or more processors to generate one or more additional instances comprises:
instructions for causing one or more processors to generate n−1 additional instances of said logic-level representation to derive an abstracted memory column comprising n instances of said logic-level representation.

30. The computer readable medium of claim 27, wherein the instructions for causing one or more processors to abstract comprises:
instructions for causing one or more processors to derive a gate-level representation for said representative memory cell; and
instructions for causing one or more processors to abstract a latch from at least a portion of said gate-level representation.

31. The computer readable medium of claim 30, wherein the instructions for causing one or more processors to derive a gate-level representation comprises:
instructions for causing one or more processors to apply symbolic analysis to a transistor level description of said representative memory cell.

32. The computer readable medium of claim 27, wherein the instructions for causing one or more processors to identify a column of n memory cells comprises:
instructions for causing one or more processors to verify that all of said n memory cells are substantially identical in structure relative to each other.

33. The computer readable medium of claim 32, further comprising:
instructions for causing one or more processors to select one of said n memory cells to be said representative memory cell.

34. The computer readable medium of claim 33, wherein the instructions for causing one or more processors to represent said column of n memory cells as a single-memory-cell column comprises:
instructions for causing one or more processors to remove all of said n memory cells except for said representative memory cell from said column.

35. The computer readable medium of claim 27, wherein said representative memory cell is initially coupled to a particular select line, and wherein the instructions for causing one or more processors to represent said column of n memory cells as a single-memory-cell column comprises:
instructions for causing one or more processors to decouple said representative memory cell from said particular select line.

36. The computer readable medium of claim 35, wherein the instructions for causing one or more processors to abstract said single-memory-cell column comprises:
instructions for causing one or more processors to couple said logic-level representation of said representative memory cell to said particular select line.

37. The computer readable medium of claim 27, wherein the instructions for causing one or more processors to generate additional instances of said logic-level representation comprises:
instructions for causing one or more processors to generate one or more additional instances of said logic-level representation; and
instructions for causing one or more processors to couple, for each additional instance generated, that instance to a distinct select line.

38. The computer readable medium of claim 37, wherein the instructions for causing one or more processors to generate additional instances of said logic-level representation further comprises:
instructions for causing one or more processors to make an explicit assumption that selection of each select line is mutually exclusive relative to all other select lines.

39. The computer readable medium of claim 27, wherein said abstracted memory column is cycle ready.

* * * * *